US012618890B2

(12) United States Patent
Chen et al.

(10) Patent No.: US 12,618,890 B2
(45) Date of Patent: May 5, 2026

(54) METHOD, DEVICE, AND SYSTEM FOR PROCESSING TRANSMISSION LINE PULSE DATA

(71) Applicant: AIP Technology Corporation, Grand Cayman (KY)

(72) Inventors: Tung-Yang Chen, ZhuBei (TW); Pi-Yuan Hsiao, ZhuBei (TW); Yu-An Chen, ZhuBei (TW); Chang-Lin Wu, ZhuBei (TW)

(73) Assignee: AIP TECHNOLOGY CORPORATION, Grand Cayman (KY)

( * ) Notice: Subject to any disclaimer, the term of this patent is extended or adjusted under 35 U.S.C. 154(b) by 135 days.

(21) Appl. No.: 18/595,681

(22) Filed: Mar. 5, 2024

(65) Prior Publication Data

US 2025/0231230 A1     Jul. 17, 2025

(30) Foreign Application Priority Data

Jan. 11, 2024     (TW) ................................ 113101214

(51) Int. Cl.
*G01R 31/00*         (2006.01)
*G01R 31/12*         (2020.01)
*G01R 31/14*         (2006.01)
*G01R 31/30*         (2006.01)

(52) U.S. Cl.
CPC ......... *G01R 31/1227* (2013.01); *G01R 31/14* (2013.01); *G01R 31/3008* (2013.01)

(58) Field of Classification Search
CPC .. G01R 31/002; G01R 31/1227; G01R 31/14; G01R 31/3008
See application file for complete search history.

(56) References Cited

U.S. PATENT DOCUMENTS

| | | | | |
|---|---|---|---|---|
| 9,297,852 | B2 * | 3/2016 | Dunnihoo | .......... G01R 31/2879 |
| 2019/0051646 | A1 * | 2/2019 | Salcedo | ............... H10D 89/713 |
| 2019/0146012 | A1 * | 5/2019 | Veil | ...................... H01H 47/002 |
| | | | | 702/64 |
| 2019/0206858 | A1 * | 7/2019 | Lin | ...................... H10D 62/364 |

FOREIGN PATENT DOCUMENTS

| | | | |
|---|---|---|---|
| CN | 104678270 | A | 6/2015 |
| CN | 104678270 | B | 6/2017 |
| CN | 110361613 | A | 10/2019 |
| CN | 111900158 | A | 11/2020 |
| CN | 113805044 | * | 12/2021 |
| CN | 113805044 | A | 12/2021 |
| CN | 117350241 | A | 1/2024 |
| TW | I243912 | B | 11/2005 |

* cited by examiner

*Primary Examiner* — Thang X Le
(74) *Attorney, Agent, or Firm* — Birch, Stewart, Kolasch & Birch, LLP

(57)         ABSTRACT
The disclosure describes a method, a device, and a system for processing transmission line pulse data. In the method, the component characteristic of a protection component is determined. A voltage-current characteristic generated by applying transmission pulses to the protection component is analyzed based on the transmission line pulse data of the protection component. Based on the design window such as an operation voltage value, a breakdown voltage value, and a required current capability, a corresponding visual graph is generated to determine the characteristic, advantages, and disadvantages of the protection component more accurately.

14 Claims, 8 Drawing Sheets

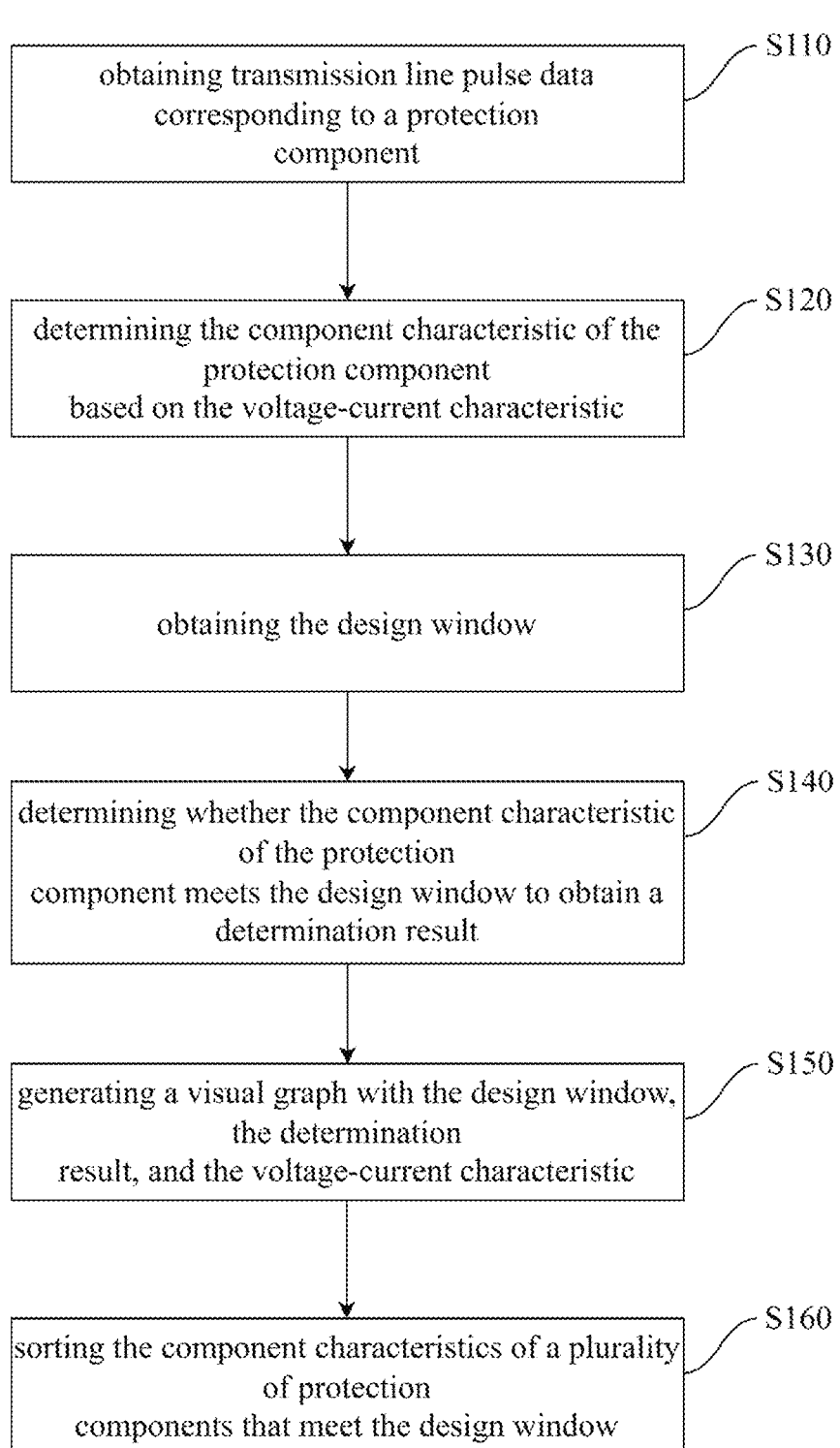

obtaining transmission line pulse data
corresponding to a protection
component
S110 determining the component characteristic of the
protection component
based on the voltage-current characteristic
S120 obtaining the design window
S130 determining whether the component characteristic
of the protection
component meets the design window to obtain a
determination result
S140 generating a visual graph with the design window,
the determination
result, and the voltage-current characteristic
S150 sorting the component characteristics of a plurality
of protection
components that meet the design window
S160

Fig. 1

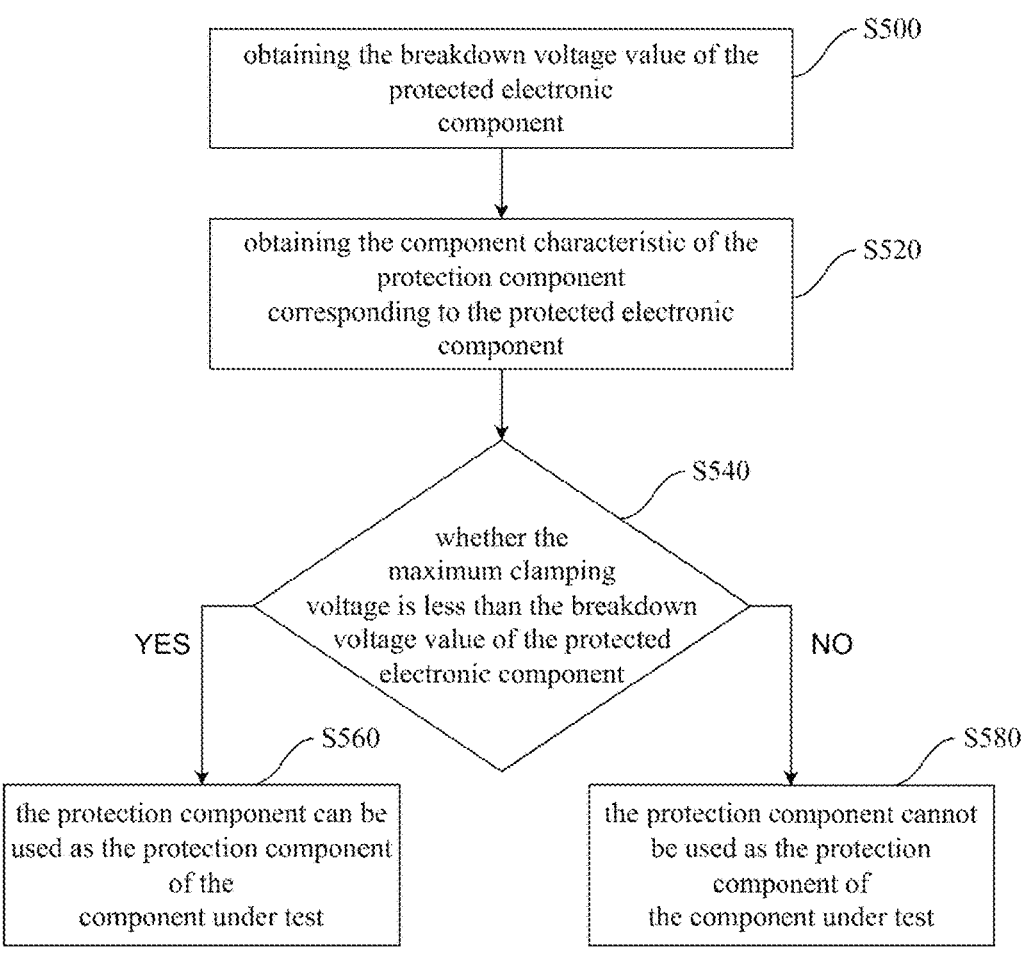

obtaining the breakdown voltage value of the protected electronic component — S500 obtaining the component characteristic of the protection component corresponding to the protected electronic component — S520 whether the maximum clamping voltage is less than the breakdown voltage value of the protected electronic component — S540

YES

NO the protection component can be used as the protection component of the component under test — S560 the protection component cannot be used as the protection component of the component under test — S580

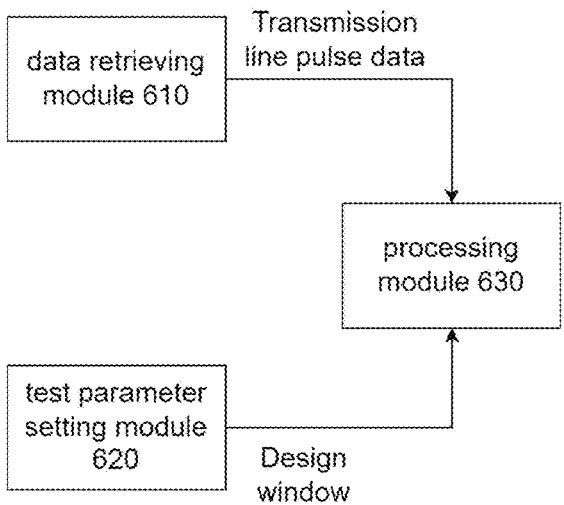

data retrieving module 610

Transmission line pulse data processing module 630 test parameter setting module 620

Design window

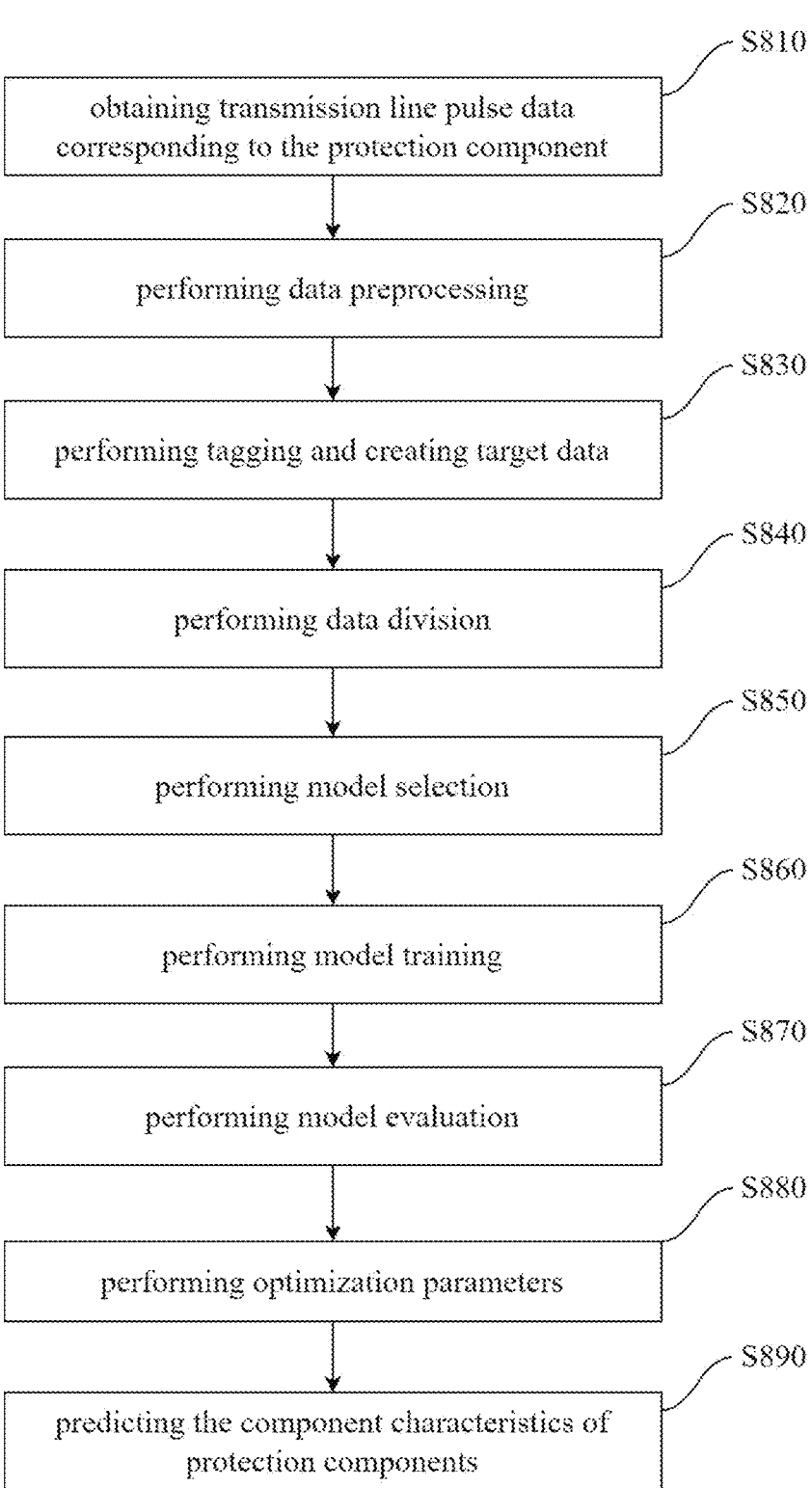

S810
obtaining transmission line pulse data corresponding to the protection component S820
performing data preprocessing S830
performing tagging and creating target data S840
performing data division S850
performing model selection S860
performing model training S870
performing model evaluation S880
performing optimization parameters S890
predicting the component characteristics of protection components

Fig. 8

METHOD, DEVICE, AND SYSTEM FOR PROCESSING TRANSMISSION LINE PULSE DATA

BACKGROUND OF THE INVENTION

This application claims priority for the TW patent application No. 113101214 filed on 11 Jan. 2024, the content of which is incorporated by reference in its entirely.

FIELD OF THE INVENTION

The present invention relates to a system and a method for analyzing data in an electrostatic discharge testing field, particularly to analysis for transmission line pulse (TLP) data.

DESCRIPTION OF THE RELATED ART

In the existing technology, electrostatic discharge (ESD) testing is another method commonly used to evaluate the performance of protection components. For example, the protection component is a transient voltage suppressor. ESD testing simulates real-world electrostatic charging events, such as human body model (HBM) testing, to determine the response and effectiveness of protective components in such events. However, ESD testing also has some shortcomings. For example, it may not provide sufficient information to completely describe all important characteristics of protection components and may ignore some key performance indicators, such as clamping voltage and leakage current.

In order to determine the characteristics of the protection components, those skilled in the art will further use transmission line pulse (TLP) testing. The traditional TLP testing method can only measure the response of protection components within a constant time period and a required current capability. This makes it difficult for those skilled in the art to obtain comprehensive and accurate information about protection components in different application scenarios and environmental conditions. For example, traditional TLP testing may not be able to simulate long-term low-current applications or high-frequency current pulse events. In addition, traditional TLP testing methods may ignore the performance changes of protection components in different environmental conditions (such as different temperature and humidity conditions).

In addition, traditional TLP testing methods usually require a lot of manual operations and human resources. For example, those skilled in the art may need to manually configure testing equipment and make ongoing monitoring and adjustments during a testing process. This not only increases the time and cost of testing, but also increases the risk of errors during the testing process.

Therefore, based on the existing technology, traditional ESD testing and TLP testing methods have many limitations and deficiencies in determining the complete characteristics of protection components. These deficiencies limit those skilled in the art from completely understanding the performance of protection components, thereby affecting the selection and application of protection components, which may cause poor protection of electronic devices in transient voltage events. This emphasizes the importance and urgency of developing a new, more comprehensive and more effective method for analysis and processing of protection components to meet the needs of different applications and environments and to improve the protection effectiveness of electronic devices.

SUMMARY OF THE INVENTION

In order to achieve the foregoing objectives, the present invention provides a method for processing transmission line pulse data, which is performed by a processing device to determine whether the component characteristic of at least one protection component meets a design window. The method includes: obtaining the transmission line pulse data that includes a voltage-current characteristic generated by applying transmission pulses to the at least one protection component; determining the component characteristic of the at least one protection component based on the voltage-current characteristic; obtaining the design window; determining whether the component characteristic of the at least one protection component meets the design window to obtain a determination result; and generating a visual graph with the design window, the determination result, and the voltage-current characteristic.

In an embodiment, the design window is configured to determine the operating range and the safe range of a protected electronic component.

In an embodiment, the transmission line pulse data further include electric leakage information. The electric leakage information includes electric leakage values generated by applying different the transmission pulses to the protection component. The step of determining the component characteristic of the protection component includes: based on a given component breakdown condition, determining whether the electric leakage values of the electric leakage information are greater than a current threshold value of the component breakdown condition; when the electric leakage value meets the component breakdown condition, respectively configuring a current and a voltage corresponding to the electric leakage value (i.e., the last electric leakage value before the breakdown of the protection component) closest to and less than the current threshold value as a secondary breakdown current (It2) and a secondary breakdown voltage (Vt2); and when the electric leakage value does not meet the component breakdown condition, respectively configuring a current and a voltage corresponding to the highest electric leakage value as a secondary breakdown current (It2) and a secondary breakdown voltage (Vt2).

In an embodiment, the design window includes an operating voltage value, a breakdown voltage value, and a required current capability. The step of determining whether the component characteristic of the protection component meets the design window includes: configuring the lowest voltage value of the transmission line pulse data less than the secondary breakdown voltage as a holding voltage; configuring the highest voltage value of the transmission line pulse data less than the secondary breakdown voltage as a trigger voltage; determining whether the component characteristic of the protection component meets the design window; and when the component characteristic meets the design window, the holding voltage of the protection component is greater than the operating voltage value, the trigger voltage is less than the breakdown voltage value, the secondary breakdown current is greater than the required current capability, and the secondary breakdown voltage is less than the breakdown voltage value.

In an embodiment, the at least one protection component includes a plurality of protection components. When the component characteristics of the plurality of protection components meet the design window, the component characteristics of the plurality of protection components that meet the design window are sorted. The component characteristic may be, for example, a trigger voltage, a holding voltage, a secondary breakdown current, a secondary breakdown voltage and/or a transient on-state resistance. Especially, the component characteristics are sorted in the order of from a low transient on-state resistance to a high transient on-state resistance.

The present invention also provides a device for processing transmission line pulse data, which is configured to determine whether the component characteristic of at least one protection component meets a design window. The device for processing transmission line pulse data includes a data retrieving module, a test parameter setting module, and a processing module. The data retrieving module is configured to obtain transmission line pulse data that includes a voltage-current characteristic generated by applying transmission pulses to the at least one protection component. The test parameter setting module is configured to receive the design window. The processing module is coupled to the data retrieving module and the test parameter setting module. The processing module is configured to determine the component characteristic of the protection component based on the voltage-current characteristic and determine whether the component characteristic of the at least one protection component meets the design window to obtain a determination result, thereby generating a visual graph with the design window, the determination result, and the voltage-current characteristic.

In an embodiment, the transmission line pulse data further include electric leakage information. The electric leakage information includes electric leakage values generated by applying the different transmission pulses to the at least one protection component. When the processing module determines the component characteristic of the at least one protection component, the processing module determines whether the electric leakage values of the electric leakage information are greater than a current threshold value of a given component breakdown condition based on the component breakdown condition. When the electric leakage value meets the component breakdown condition, a current and a voltage corresponding to the electric leakage value closest to and less than the current threshold value (i.e., the last electric leakage value before the breakdown of the protection component) are respectively configured as a secondary breakdown current and a secondary breakdown voltage. When the electric leakage value does not meet the component breakdown condition, a current and a voltage corresponding to the highest electric leakage value are respectively configured as a secondary breakdown current and a secondary breakdown voltage.

In an embodiment, the design window includes an operating voltage value, a breakdown voltage value, and a required current capability. When the processing module determines whether the component characteristic of the at least one protection component meets the design window, the lowest voltage value of the transmission line pulse data less than the secondary breakdown voltage is configured as a holding voltage and the highest voltage value of the transmission line pulse data less than the secondary breakdown voltage is configured as a trigger voltage. When the processing module determines that the holding voltage of the at least one protection component is greater than the operating voltage value, that the trigger voltage is less than the breakdown voltage value, that the secondary breakdown current is greater than the required current capability, and that the secondary breakdown voltage is less than the breakdown voltage value, the component characteristic of the at least one protection component meets the design window.

In an embodiment, the at least one protection component includes a plurality of protection components. When the component characteristics of the plurality of protection components meet the design window, the processing module sorts the component characteristics of the plurality of protection components that meet the design window.

In an embodiment, the component characteristic is the trigger voltage, the holding voltage, the secondary breakdown current, the secondary breakdown voltage, or a transient turn-on resistance.

In an embodiment, the device for processing the transmission line pulse data further includes a filtering module coupled to the processing module. The filtering module is configured to obtain the breakdown voltage value of a protected electronic component and determine the maximum clamping voltage of the at least one protection component less than the breakdown voltage value of the protected electronic component to determine whether the at least one protection component is used as a protection component of the protected electronic component.

In an embodiment, the device for processing the transmission line pulse data further includes a historical test storing module coupled to the processing module and configured to store the component characteristics of protection components that have already been tested and the corresponding design window. The design window corresponds to at least one of a physical characteristic, an operating environment, and life expectancy of the protected electronic component.

In an embodiment, the device for processing the transmission line pulse data further includes an artificial intelligence recommendation module coupled to the historical test storing module and the test parameter setting module and configured to recommends the parameters of at least one of corresponding physical characteristics, an operating environment, and life expectancy as a recommended design window based on the component characteristics of protection components that have already been tested and the corresponding design window.

In an embodiment, the artificial intelligence recommendation module is further configured to provide a design window customized by a user to continuously optimize and adjust the recommended design window.

In an embodiment, the device for processing the transmission line pulse data further includes an artificial intelligence-assisted determination module coupled to the processing module. The processing module is configured to employ the artificial intelligence-assisted determination module to determine the secondary breakdown voltage, the secondary breakdown current, the trigger voltage, and the holding voltage of the transmission line pulse data.

The present invention provides a system for detecting transmission line pulses, which includes the device for processing the transmission line pulse data and a connection module electrically connected to the data retrieving module and at least one protection component.

Compared to the Conventional Technology, the Present Invention Includes the Following Effects:

1. Improve accuracy and consistency of testing: The automated testing method and the system of the present invention reduce human intervention, thereby reducing errors in the testing process and ensuring the accuracy and consistency of testing results. This is important for performance evaluation and selection of protection components, which helps ensure that the finally selected protection components meet predetermined technical standards and safety requirements.

2. Accelerate development and launch process of products: Through automated and accurate testing, the selection and verification process of protection components can be accelerated, thereby shortening the product development cycle and accelerating the product launch process.

3. Optimize design and reduce costs: The artificial intelligence recommendation module of the present invention can recommend the most suitable testing parameters and the selection of protection components based on the historical testing information and the present testing requirements. This helps optimize design solutions, reduce unnecessary costs of trial and error, and improve the price-performance ratio of products.

4. Enhance safety and reliability of products: Through detailed testing and analysis of protection components, one can ensure that they provide adequate protection in specific operating conditions and environments, thereby enhancing the safety and reliability of the entire system or product. This not only helps reduce potential security risks, but also increases the trust and satisfaction of customers.

5. Recording and analyzing data: The historical testing storing module is configured to provide a platform for recording and analyzing complete data. This not only helps understand and improve the performance of protection components, but also provides a valuable database for future research, development and optimization.

6. Elasticity and adaptability: The system and the method of the present invention have high elasticity and adaptability and can provide corresponding solutions according to different testing requirements and application scenarios. The flexibility and adaptability enable the present invention to meet variable engineering and technical requirements and provide wider application values.

7. Improve testing efficiency: Automated testing processes can greatly improve testing efficiency, reduce the time required for testing, and increase testing throughput. This is particularly important for large-scale work in testing and analysis, which can effectively save resources and improve operating efficiency.

Below, embodiments are described in detail in cooperation with the attached drawings to make easily understood the characteristics and accomplishments of the present invention.

BRIEF DESCRIPTION OF THE DRAWINGS

FIG. 1 is a flowchart of a method for processing transmission line pulse data according to an embodiment of the present invention;

FIG. 5 is a flowchart of a method for filtering protection components according to an embodiment of the present invention;

FIG. 6 is a diagram schematically showing a device for processing transmission line pulse data according to an embodiment of the present invention;

FIG. 8 is a flowchart of a method for processing transmission line pulse data combined with machine learning according to an embodiment of the present invention.

DETAILED DESCRIPTION OF THE INVENTION

Figure 2:
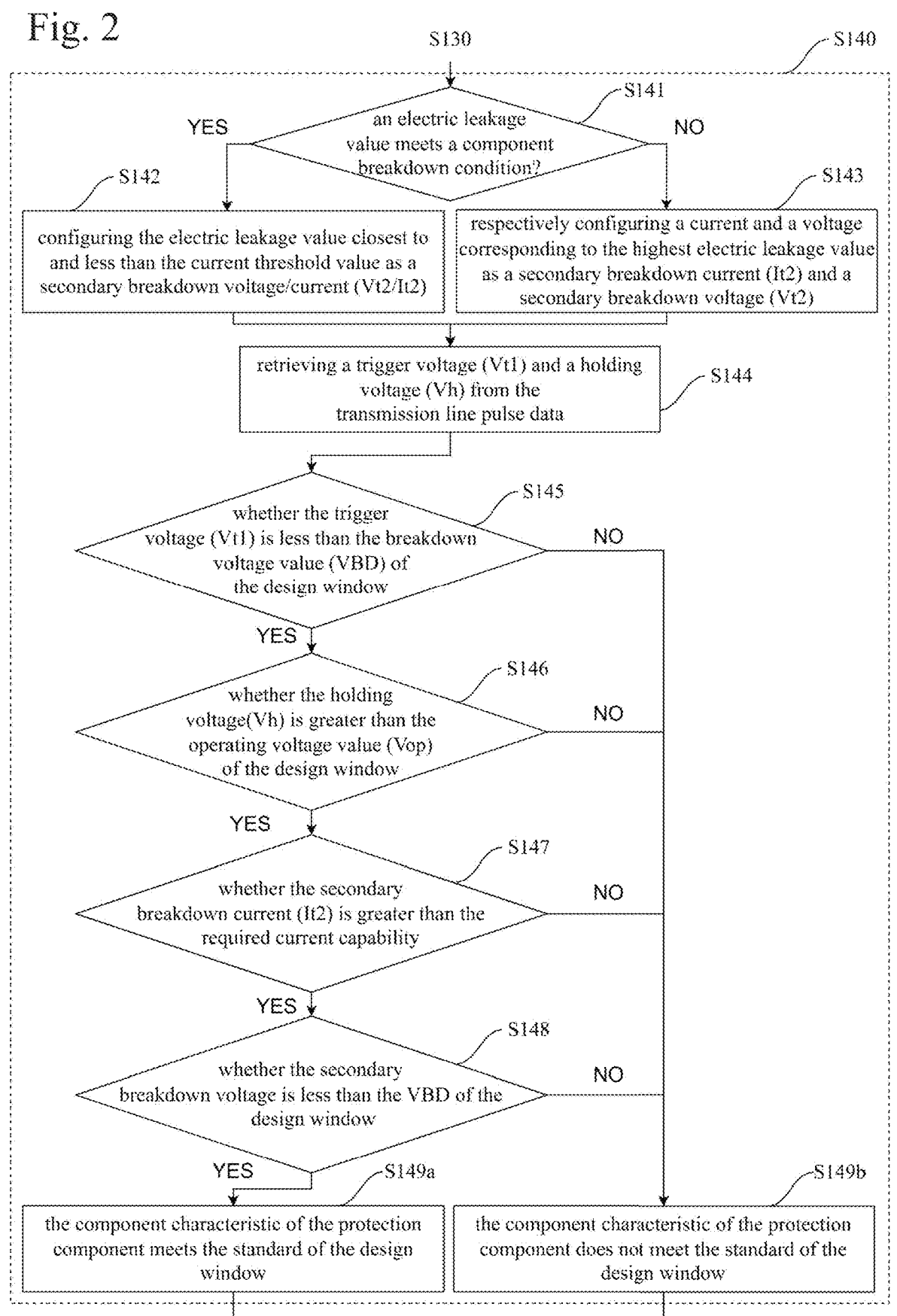
FIG. 2 is a flowchart of a method for processing transmission line pulse data according to another embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

The present invention provides the following embodiments in order to overcome the shortcomings of the existing technology in electrostatic discharge (ESD) testing and transmission line pulse (TLP) testing methods.

Glossary

Characteristic of TLP component, which are represented with the key parameters of performance of ESD protection components, including those of trigger voltage/current (Vt1, It1), holding voltage/current (Vh, Ih), secondary breakdown voltage/current (Vt2, It2), and transient on-state resistance (Ron). These parameters are introduced as follows:

Transmission line pulse data include a voltage-current characteristic and an electric leakage value generated by applying transmission line pulses to the protection component. The voltage-current characteristic can be plotted as a current-voltage curve (I-V curve) and the electric leakage value can help determine the secondary breakdown voltage and current of the protection component.

Trigger voltage/current (Vt1, It1) represents the highest voltage/current achieved by the protection element at the beginning of its operation.

Holding voltage/current (Vh, Ih) is applied to the component under test. The holding voltage is usually within the operating voltage range of the component under test.

Secondary breakdown voltage/current (Vt2, It2) represents the secondary breakdown phenomenon of protected electronic components during ESD testing. After the protected electronic component experiences the first breakdown phenomenon, the voltage continues rising. When the secondary breakdown voltage is reached, severer voltage fluctuations and possible permanent damage will occur.

On-state resistance is also called transient turn-on resistance (Ron), which represents the reciprocal of the linear slope of the I-V curve of the TLP component. The on-state resistance is obtained after the holding voltage/current occurs.

Glossary of Design Window

Operating voltage value (Vop) represents the voltage of an electronic component or a system in a normal condition.

Breakdown voltage value (VBD) represents a voltage where an electronic component or a material begins to fail when the voltage rises to a certain level.

Required current capability represents the maximum current that an electronic component can safely operate in a normal state or a specified condition. Take ESD (electrostatic discharge) protection components as an example. The required current capability represents the maximum current that the protection component can withstand without being damaged.

The present invention provides a method for processing transmission line pulse data. The embodiment of the method for processing transmission line pulse data is detailed as follows.

Please refer to FIG. 1. FIG. 1 is a flowchart of a method for processing transmission line pulse data according to an embodiment of the present invention.

According to an embodiment, FIG. 1 includes Steps S110~S150 that are detailed as follows.

Step S110: obtaining transmission line pulse data corresponding to a protection component.

The transmission line pulse data include a voltage-current characteristic generated by applying transmission pulses to at least one protection component.

The protection component may be a clamping component, such as a transient voltage suppressor, a diode, a metal oxide varistor, a bypass capacitor, an avalanche diode, a Zener diode, and the like.

Furthermore, the clamping component is used to protect an electronic component (i.e., the protected electronic component described in the Specification) from transient excessive noise damage. When the voltage in the circuit exceeds a specific threshold value, the clamping component can limit or "clamp" the voltage to within a safe range.

Step S120: determining the component characteristic of the protection component based on the voltage-current characteristic.

Step S130: obtaining the design window.

The design window is used to determine the operating range and safe range of the protected electronic component. The design window may also be called acceptance criteria or an equivalent noun. The acceptance criteria mean that the protection component must pass the corresponding test based on the operating conditions required for the circuit equipped with the protection component or the protected electronic component. Alternatively, the design window can be used as a manner to strictly select excellent protection components.

Step S140: determining whether the component characteristic of the protection component meets the design window to obtain a determination result.

Step S150: generating a visual graph with the design window, the determination result, and the voltage-current characteristic.

The component characteristic includes a current-voltage (I-V) curve generated by applying transmission line pulses to the protection component.

According to another embodiment, FIG. 1 further includes Step S160 detailed as follows.

Step S160: sorting the component characteristics of a plurality of protection components that meet the design window.

Figure 3:
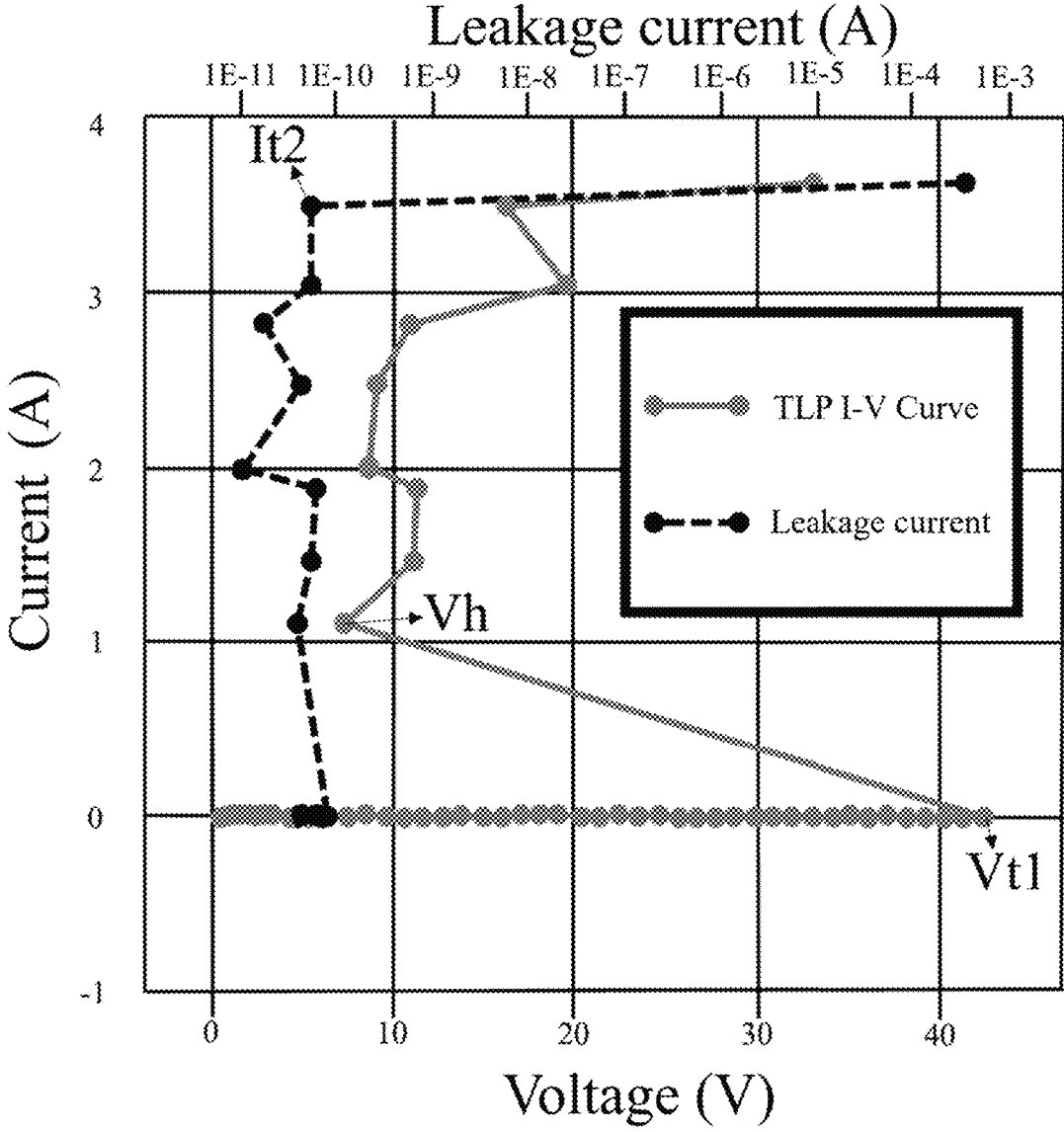
FIG. 3 is a diagram showing the curve of leakage current and a transmission line pulse (TLP) I-V curve corresponding to the component characteristic of a protection component according to an embodiment of the present invention.
Figure 4:
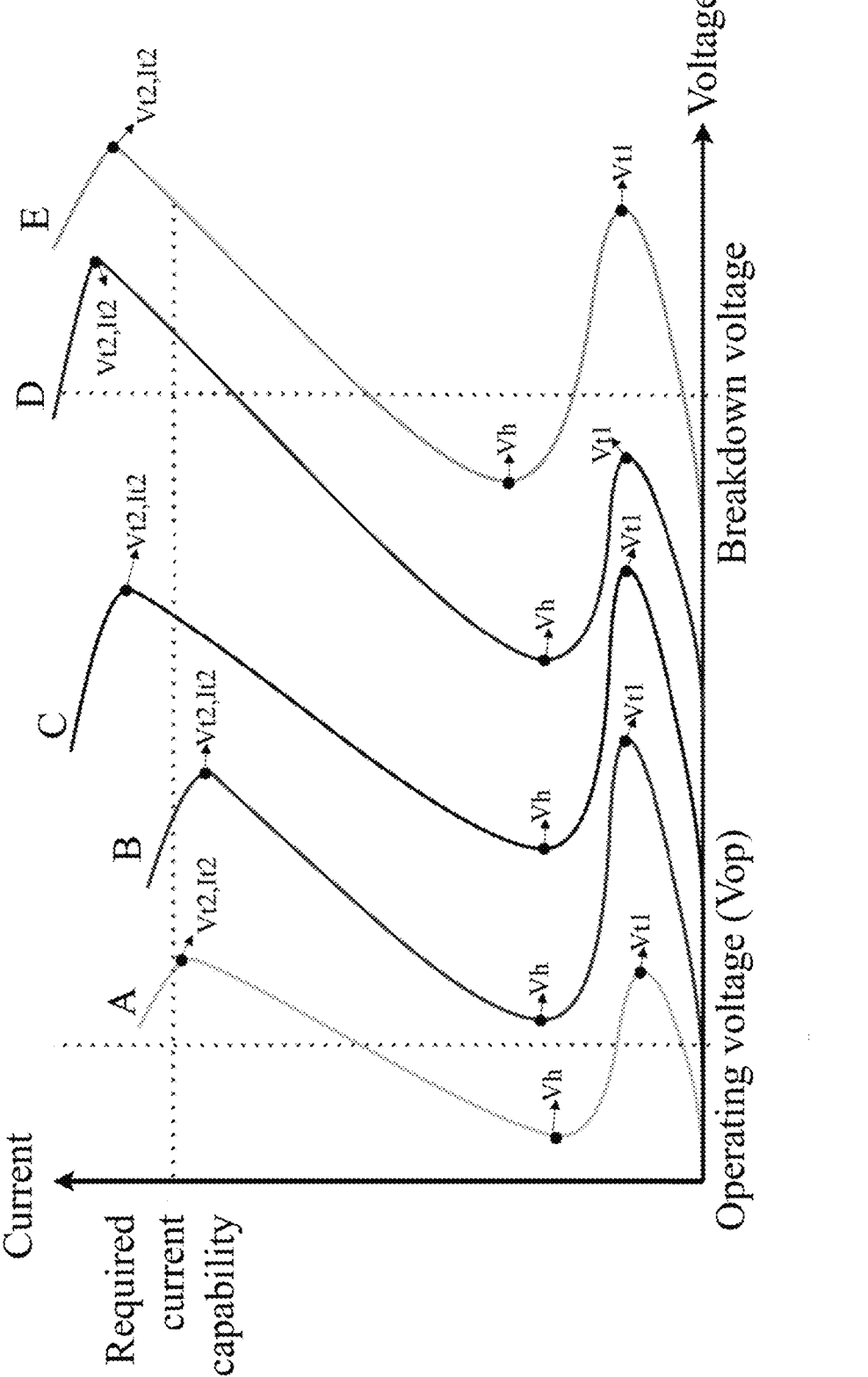
FIG. 4 is a diagram showing a visual graph corresponding to the component characteristic of a protection component according to an embodiment of the present invention.

Please refer to FIGS. 2-4. FIG. 2 is a flowchart of a method for processing transmission line pulse data according to another embodiment of the present invention. FIG. 2 describes the specific process for determining the component characteristic of the protection component. FIG. 3 is a diagram showing the curve of leakage current and a transmission line pulse (TLP) I-V curve corresponding to the component characteristic of a protection component according to an embodiment of the present invention. FIG. 4 is a diagram showing a visual graph corresponding to the component characteristic of a protection component according to an embodiment of the present invention.

According to further embodiment, FIG. 2 describes that Step S140 includes Steps S141~S149 after Step S130 of generating the visual graph of FIG. 3. Steps S141~S149 are detailed as follows.

Step S141: determining whether to have an electric leakage value that meets a component breakdown condition based on the electric leakage information of the transmission line pulse data: if yes, performing Step S142; and if no, performing Step S143.

Based on the given component breakdown condition, a leakage current test can be performed on the protection component and the leakage current is recorded to determine whether the electric leakage value is greater than a current threshold value after each transmission line pulse is sent. For example, the current threshold value may be at least 3 orders of magnitude of current surge, such as $10^3$.

In a normal state, the electric leakage value of the protection component is very small. When a transmission line pulse is sent to suddenly increase the measured electric leakage value by more than 3 orders of magnitude, the breakdown event of the protection component has already occurred. Take FIG. 3 as an example. The electric leakage value suddenly increased from $10^{-10}$ to $10^{-4}$ and the index increased from $-10$ to $-4$. Therefore, the difference is $|-10-(-4)|=6$ orders of magnitude, which meets the current threshold value of the component breakdown condition.

As a result, based on the component breakdown condition, a current and a voltage corresponding to the last electric leakage value before the breakdown event of the protection component are respectively determined and defined as a secondary breakdown current (It2) and a secondary breakdown voltage (Vt2).

Step S142: configuring the electric leakage value closest to and less than the current threshold value as a secondary breakdown voltage/current (Vt2/It2), namely the current and the voltage corresponding to the last electric leakage value before the breakdown event of the protection component. Then, the process proceeds to Step S144.

Step S143: respectively configuring a current and a voltage corresponding to the highest electric leakage value as a secondary breakdown current (It2) and a secondary breakdown voltage (Vt2). Then, the process proceeds to Step S144.

If any electric leakage value of the electric leakage information is not greater than the current threshold value, the secondary breakdown current (It2) and the secondary breakdown voltage (Vt2) are not defined based on the component breakdown condition. In such a case, a current and a voltage corresponding to the highest electric leakage value are respectively configured as a secondary breakdown current and a secondary breakdown voltage when the protection component receives the transmission line pulse to generate the highest electric leakage value.

Step S144: retrieving a trigger voltage (Vt1) and a holding voltage (Vh) from the transmission line pulse data. Specifically, the trigger voltage (Vt1) is the maximum voltage value that does not meet the component breakdown condition [i.e., before the secondary breakdown current (It2) occurs]. The holding voltage (Vh) is the minimum voltage value that does not meet the component breakdown condition after the trigger voltage (Vt1) occurs.

FIG. 4 is a visual graph with the design window and the voltage-current characteristic generated in Step S130. FIG. 4 is a visual graph that shows the current-voltage curves of protection components A~D. Besides, Step S142 or Step S143 configures and marks the secondary breakdown current (It2) in the visual graph and Step S144 configures and marks the holding voltage (Vh) and the trigger voltage (Vt1) in the visual graph.

Step S145: determining whether the trigger voltage (Vt1) is less than the breakdown voltage value (VBD) of the design window: if yes, performing Step S146; and if no, performing Step S150.

Step S146: determining whether the holding voltage (Vh) is greater than the operating voltage value (Vop) of the design window: if yes, performing Step S147; and if no, performing Step S150.

Step S147: determining whether the secondary breakdown current (It2) is greater than the required current capability: if yes, performing Step S147; and if no, performing Step S150.

Step S148: determining whether the secondary breakdown voltage is less than the breakdown voltage value (VBD) of the design window: if yes, performing Step S149; and if no, performing Step S150.

The order of Steps S145~S148 can be adaptable according to requirements. The order does not affect the result of determining whether the component characteristic of the protection component meets the design window.

Step S149a: determining that the component characteristic of the protection component meets the standard of the design window.

Step S149b: determining that the component characteristic of the protection component does not meet the standard of the design window.

Due to the limitations of the traditional transmission line pulse testing method in providing information, it can only provide the breakdown voltage value of the protection component. In the embodiment, by visually analyzing the current-voltage (I-V) curve of the protection component, it is known that the maximum voltage value and the minimum voltage value of the protection component can respectively be Vt1 and Vh. Then, it is determined whether the maximum voltage value and the minimum voltage value of the protection component meet the conditions of the design window to determine the quality of the protection component.

Take the visual graph of protection components A~E in FIG. 4 as an example. Based on the given design window, the protection component is tested. The design window includes an operating voltage value (Vop), a breakdown voltage value (VBD), and a required current capability. From FIG. 4, the following results are observed. For protection components B, C, D, and E, the holding voltage (Vh) is greater than the operating voltage value (Vop). For protection components A, B, C, and D, the trigger voltage (Vt1) is less than the breakdown voltage value (VBD). For protection components C, D, and E, the secondary breakdown current is greater than the required current capability. For protection components A, B, and C, the secondary breakdown voltage (Vt2) is less than the breakdown voltage value (VBD).

Therefore, only protection component C among protection components A~E meets conditions that include the trigger voltage less than the breakdown voltage of the design window, the holding voltage greater than the operating voltage value of the design window, the secondary breakdown current greater than the required current capability of the design window, and the secondary breakdown voltage less than the breakdown voltage of the design window.

As mentioned above, the design window is configured to filter the excellent protection component based on the operating environment of the electronic component. Thus, when the operating voltage value (Vop) and the breakdown voltage value (VBD) of an electronic component are determined, the protection component that can clamp the maximum voltage value (Vt1) and the minimum voltage value (Vh) inputted to the electronic component between the operating voltage (Vop) and the breakdown voltage value (VBD) is selected. Furthermore, when the required current capability of an electronic component is determined, the protection component that can withstand the secondary breakdown current (It2) greater than the upper limit of the required current capability is selected. As a result, it is observed that protection component C is the best choice in FIG. 4.

Moreover, the component characteristic of the protection component is determined based on the transient on-state resistance. When the slope of the linear part of the TLP I-V curve is higher (i.e., Ron is lower), the protection component that is turned on has a smaller resistance. When the transient event of the protection component with a smaller resistance occurs (i.e., the voltage or current suddenly increases), the protection component is more rapidly turned on to provide more effective protection. Thus, take the visual graph of protection components A~E in FIG. 4 as an example. The curve slope of protection component A is greater than that of protection component C. The curve slope of protection component C is greater than that of protection component B. The curve slope of protection component B is greater than that of protection component E. The curve slope of protection component E is greater than that of protection component D. In the foregoing analysis, the minimum voltage value (Vh) of protection component A less than the operating voltage (Vop) does not meet the standard of the design window. Thus, protection component C is still the best choice.

Step S150: sorting the protection components that meet the design window in the recommended order of from a low transient on-state resistance to a high transient on-state resistance (i.e., from high slope to low slope).

The clamping voltage of the protection component is insufficiently low, which causes damage to the protected electronic component to fail but allows a current to pass through the protection component. According to yet another embodiment, the protection component should be configured to meet the application setting values as much as possible to avoid such a case.

Please refer to FIG. 5. FIG. 5 is a flowchart of a method for filtering protection components according to an embodiment of the present invention.

According to another embodiment, FIG. 5 includes Steps S500~S580 detailed as follows.

Step S500: obtaining the breakdown voltage value of the protected electronic component.

Step S520: obtaining the component characteristic of the protection component corresponding to the protected electronic component (obtained in Steps S130~S140).

Step S540: determining whether the maximum clamping voltage is less than the breakdown voltage value of the protected electronic component: if yes, performing Step S560; and if no, performing Step S580.

Step S560: determining that the protection component is used as the protection component of the component under test.

Step S580: determining that the protection component is not used as the protection component of the component under test.

The embodiment focuses on the sufficiently low clamping voltage and examines the electrostatic discharge robustness of a single protection component individually. The embodiment filters appropriate protection components to prevent from causing electrostatic discharge damage to important protected electronic components (such as main chips) based on the component characteristics generated in Steps S130~S140.

The present invention further provides a device for processing transmission line pulse data whose embodiment is detailed as follows.

Please refer to FIG. 6. FIG. 6 is a diagram schematically showing a device for processing transmission line pulse data according to an embodiment of the present invention.

As shown in FIG. 6, a device 600 for processing transmission line pulse data is configured to determine the component characteristic of at least one protection component. The device 600 for processing transmission line pulse data includes a data retrieving module 610, a test parameter setting module 620, and a processing module 630. The data retrieving module 610 is configured to obtain transmission line pulse data that correspond to the protection component and include a voltage-current characteristic generated by applying transmission pulses to the protection component. The current of the transmission line pulses is applied to the protection component from low to high. The test parameter setting module 620 is configured to receive the design window. The design window includes an operating voltage value (Vop), a breakdown voltage value (VBD), and a required current capability. The processing module 630 is coupled to the data retrieving module 610 and the test parameter setting module 620 and configured to generate a visual graph with the design window and the voltage-current characteristic.

For example, the device 600 for processing transmission line pulse data may be a computer device with computing processing capabilities. The processing module 630 particularly includes hardware or a combination of software and hardware with data and/or image processing capabilities, such as a computer device, a cloud server, or the like. The processing module 630 includes a central processing unit, a graphics processor, and a memory, etc. or a microcontroller that has the necessary components integrated. For example, the data retrieving module 610 can be a component with data reception or communication capabilities. The data retrieving module 610 can receive external transmission line pulse data through a wired or wireless interface, such as receiving transmission line pulse data received by a TLP measurement machine. The TLP measurement machine may be, for example, ESDEMC TLP-1000, HANWA HED T-5000, or Thermo Scientific Celestron. The test parameter setting module 620 may be, for example, a component that performs input/output (I/O) functions and has data transmission capabilities.

The transmission line pulse data also include electric leakage information and component breakdown conditions. The component breakdown condition is defined as the leakage current of the electric leakage information greater than the current threshold value. The processing module 630 is configured to determine whether there is a current value that meets the component breakdown condition. The processing module 630 configures the current value of the transmission line pulse or the current value of the transmission line pulse with the highest current that meets the component breakdown condition as a secondary breakdown current (It2). The current threshold value may be, for example, a current that suddenly increases by two orders of magnitude. The current threshold value has been described previously so it will not be reiterated.

The processing module 630 is configured to retrieve from the transmission line pulse data the minimum voltage value as a holding voltage (Vh) and the maximum voltage value as a trigger voltage (Vt1) that do not meet the component breakdown condition. When the processing module 630 determines that the holding voltage is greater than the operating voltage value, that the trigger voltage is less than the breakdown voltage value, and that the secondary breakdown current is greater than the required current capability, the component characteristic of the protection component meets the design window.

Figure 7:
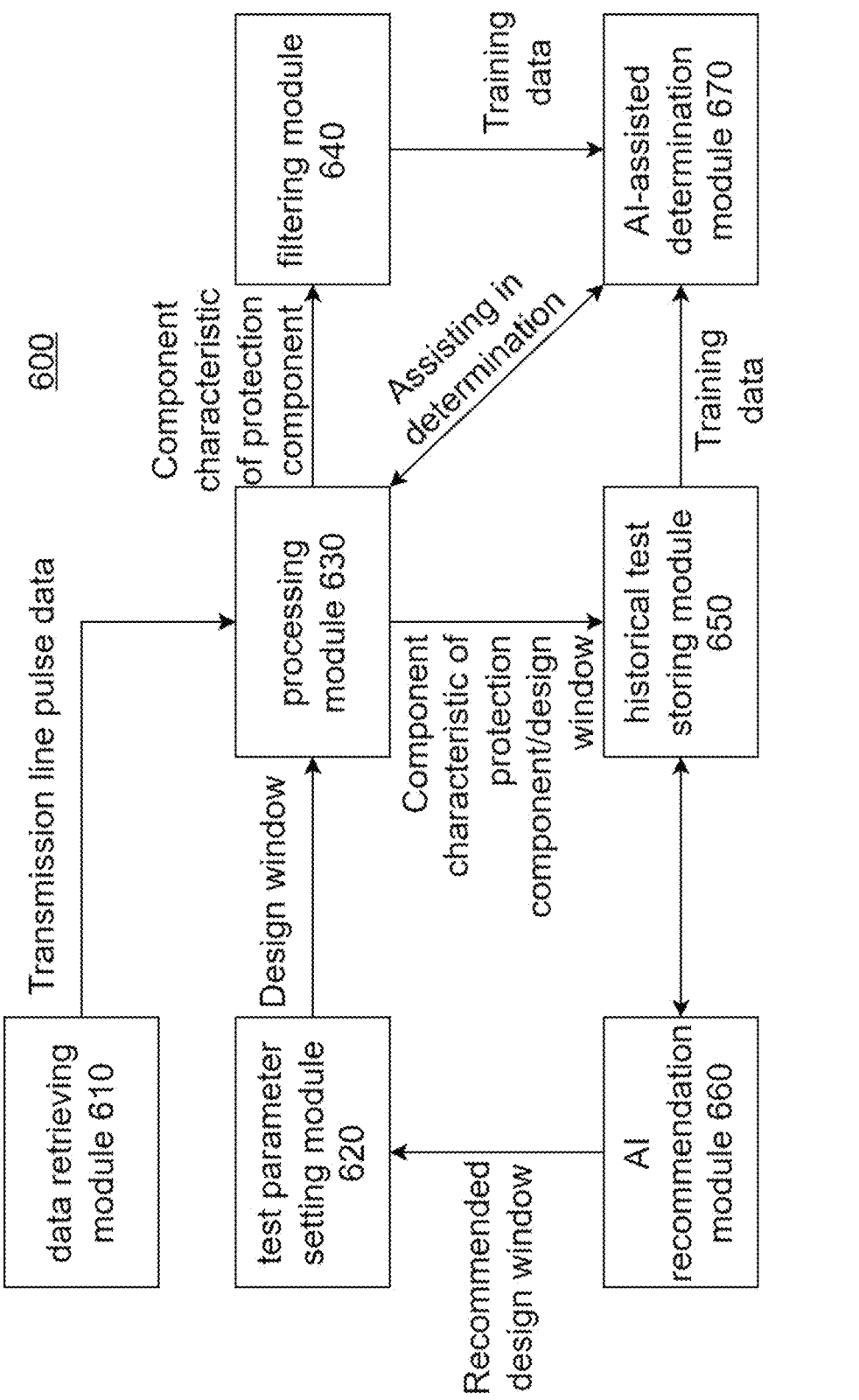
FIG. 7 is a diagram schematically showing a device for processing transmission line pulse data according to another embodiment of the present invention.

Please refer to FIG. 7. FIG. 7 is a diagram schematically showing a device for processing transmission line pulse data according to another embodiment of the present invention.

According to an embodiment, the device 600 for processing transmission line pulse data further includes a filtering module 640 coupled to the processing module 630. The filtering module 640 is configured to obtain the breakdown voltage value of the protected electronic component and determine whether the protection component is used as the protection component of the protected electronic component based on the breakdown voltage value and the component characteristic of the protection component.

According to another embodiment, the device 600 for processing transmission line pulse data further includes a historical test storing module 650 coupled to the processing module 630 and configured to store the component characteristics of protection components that have already been tested and the corresponding design window. The design window corresponds to at least one of a physical characteristic, an operating environment, and life expectancy of the protected electronic component.

The physical characteristics can include, for example, both size and shape (e.g., a tiny integrated circuit (IC) may require different protection strategies and a large power module), material composition (e.g., certain materials may be sensitive to certain voltage or current and tungsten has a higher sensitivity to high current), and connection interfaces (e.g. a component with multiple input/output (I/O) connection interfaces may require more complex protection strategies).

The operating environment can include, for example, temperature (e.g., components operating in extremely cold or hot environments may be affected differently and satellite components in space need to operate normally at an extremely low temperature), humidity (e.g., in high-humidity environments, components may be at risk of corrosion or short-circuiting), both vibration and shock (e.g., military equipment or automotive electronic equipment need to be able to withstand high levels of vibration and shock), and radiation (e.g., components in nuclear power plants need to be able to withstand high radiation environments).

The life expectancy may include, for example, short-term use (e.g., disposable medical equipment, such as electronic needles for surgery, may only last a few hours), mediumterm use (e.g., household electronic products, such as televisions or refrigerators, may need to last years) and long-term use (e.g., infrastructure equipment, such as power transformers or wind turbines, may need to last decades).

Accordingly, when the protected electronic components need to operate in a condition that includes extreme physical characteristics, an operating environment, or life expectancy, the design window should be more strictly set to filter excellent protection components.

According to yet another embodiment, the device 600 for processing transmission line pulse data further includes an artificial intelligence recommendation module 660 coupled to the historical test storing module 650 and the test parameter setting module 620 and configured to recommends the parameters of at least one of corresponding physical characteristics, an operating environment, and life expectancy as a recommended design window based on the component characteristics of protection components that have already been tested and the corresponding design window.

In the past, engineers could only rely on their own experience to preset the characteristics of the protection components required for the protected electronic components, but the engineers often could not accurately predict the complex operating environment where protected electronic components would face in the future. Therefore, in the embodiment, the artificial intelligence recommendation module 660 can use machine learning or deep learning technology to provide the recommended design window.

For example, the implementations of the artificial intelligence recommendation module 660 can be described as follows.

(1) Recommendation system based on collaborative filtering: The testing results of other similar protection components are used to recommend the best design window. For example, if an IC performs well using specific setting parameters, other similar ICs may also perform well using the same setting parameters. (2) Content-based recommendation system: The design window is recommended based on the physical characteristics, operating environment, and life expectancy of the protected electronic component. Alternatively, the characteristic engineering techniques are used to retrieve useful information from the description of the protected electronic component. (3) Deep learning recommendation system: Neural networks, especially convolutional neural networks (CNN) or recurrent neural networks (RNN), are used to process large amounts of TLP testing data to recognize and learn complex test setting modes. (4) Reinforcement learning recommendation system: The optimal design window is found from continuous experimentation and learning. An agent is used to test in a simulated environment and adjust the design window based on rewards. Specifically, the embodiment applies the concept of reinforcement learning (RL), which mainly focuses on how the agent learns the best strategy in the process of interacting with the environment. (5) Hybrid recommendation system: The foregoing methods, such as collaborative filtering and content-based recommendation, are combined to provide a more precise recommended design window.

According to further embodiment, the device 600 for processing transmission line pulse data further includes an artificial intelligence-assisted determination module 670 coupled to the processing module 630. When the processing module 630 cannot successfully obtain the determination result by determining whether the component characteristic of at least one protection component meets the design window (as shown in Steps S141~S148), the artificial intelligence-assisted determination module 670 determines the values of the transmission line pulse data closest to the secondary breakdown voltage/current (Vt2, It2), the trigger voltage (Vt1), and the holding voltage (Vh) and provides them for the processing module 630 for determination.

Furthermore, the artificial intelligence-assisted determination module 670 requires a large amount of training data to determine parameters. The training data can be provided by the historical test storing module 650 and/or the filtering module 640. Specifically, the historical test storing module 650 will store the past results of the component characteristics of the protection components analyzed by the processing module 630. These component characteristics include automatically generated results (e.g., through the flowcharts of FIGS. 1 and 2) or the results further corrected by humans. Therefore, the historical test storing module 650 is not only a data storage, but also a database for subsequent queries and analysis. In order to provide the protection capability for the protection component, the filtering module 640 will provide the breakdown voltage value of the protected electronic component, which is also the important source of training data for the artificial intelligence-assisted determination module 670.

The artificial intelligence-assisted determination module 670 mainly provides possible secondary breakdown voltage/current (Vt2, It2), trigger voltage (Vt1), holding voltage (Vh), etc. when the processing module 630 cannot successfully determine whether the protection component meets the design window. In order to perform the complex determination, the artificial intelligence-assisted determination module 670 requires a large amount of training data. These training data mainly come from the historical test storing module 650 and provides many historical analysis results to help the artificial intelligence-assisted determination module 670 "learn" and "understand" the behaviors and characteristics of the protection components. Therefore, after the training data are inputted into the artificial intelligence-assisted determination module 670, the artificial intelligence-assisted determination module 670 will learn and analyze the training data to identify specific modes and trends and perform correlation analysis on data. This enables the artificial intelligence-assisted determination module 670 to make prediction and perform determinations more accurately in new or complex situations.

Please refer to FIG. 8. FIG. 8 is a flowchart of a method for processing transmission line pulse data combined with machine learning according to an embodiment of the present invention. FIG. 8 provides the operation principle suitable for the artificial intelligence-assisted determination module 670. FIG. 8 includes Steps S810~S890 detailed as follows.

Step S810: obtaining transmission line pulse data corresponding to the protection component.

Step S820: performing data preprocessing. Data preprocessing includes, but is not limited to, cleaning data, processing missing values, standardization or normalization of data, etc. Take Vt1 as an example. The I-V curve is converted into a format suitable for model processing. For example, if one intends to adopt a convolutional neural network (CNN) deep learning model, the line segment and the maximum index are converted into a shape suitable for one-dimensional (1D) CNN.

Step S830: performing tagging and creating target data. The points of component characteristics are obtained from the analyzed data to serve as target data for the machine learning method.

Step S840: performing data division. The data are divided into a training set and a testing set to evaluate the performance of the model.

Step S850: performing model selection. The appropriate machine learning model, such as decision tree, random forest, support vector machine, convolutional neural network (CNN), or recurrent neural network (RNN), etc., is selected to train the model.

Step S860: performing model training. The training set is used to train the model. For example, the location of the inflection point can be predicted.

Step S870: performing model evaluation. The testing set is used to evaluate the performance of the model. One can use various indexes to measure the accuracy of the model, such as mean square error (MSE) or mean absolute error (MAE).

Step S880: performing optimization parameters. Parameters are optimized based on the performance of the model to improve the accuracy of the model.

Step S890: predicting the component characteristics of protection components.

Figure 9:
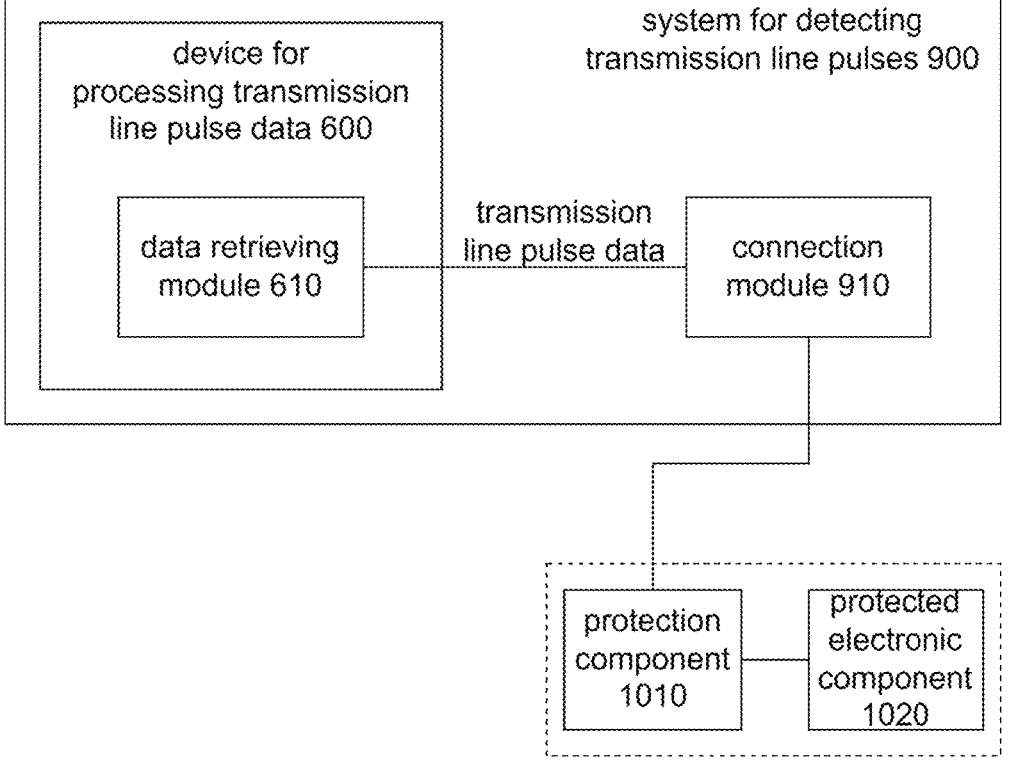
FIG. 9 is a diagram schematically showing a system for detecting transmission line pulses according to an embodiment of the present invention.

Please refer to FIG. 9. FIG. 9 is a diagram schematically showing a system for detecting transmission line pulses according to an embodiment of the present invention.

The present invention provides a system 900 for detecting transmission line pulses, which includes the device 600 for processing the transmission line pulse data and a connection module 910. The connection module 910 is electrically connected to the data retrieving module and at least one protection component 1010. Furthermore, the system 900 for detecting transmission line pulses may be, for example, a TLP measurement machine. Therefore, all existing TLP measurement machines equipped with the device 600 for processing the transmission line pulse data fall within the scope of the present invention.

As shown in FIG. 9, the connection module 910 can be connected to a single protection component 1010 or a circuit with the protection component 1010 and a protected electronic component 1020.

The connection module 910 includes a plurality of probes for connecting to specific testing points on an integrated circuit or a chip.

The embodiments described above are only to exemplify the present invention but not to limit the scope of the present invention. Any equivalent modification or variation according to the shapes, structures, characteristics and spirit disclosed in the specification is to be also included by the scope of the present invention.

What is claimed is:

1. A method for processing transmission line pulse data, which is performed by a processing device to determine whether a component characteristic of at least one protection component meets a design window, and the method comprising:

obtaining, by a data retrieving module, the transmission line pulse data that includes a voltage-current characteristic generated by applying transmission pulses to the at least one protection component, wherein the transmission line pulse data include an electric leakage information, the electric leakage information includes electric leakage values generated by applying the transmission pulses that are different to the at least one protection component;

determining, by the processing device, the component characteristic of the at least one protection component based on the voltage-current characteristic, the step of determining the component characteristic of the at least one protection component includes:

based on a component breakdown condition that is given, determining whether the electric leakage values of the electric leakage information are greater than a current threshold value of the component breakdown condition;

when the electric leakage value meets the component breakdown condition, respectively configuring a current and a voltage corresponding to the electric leakage value closest to and less than the current threshold value as a secondary breakdown current and a secondary breakdown voltage;

when the electric leakage value does not meet the component breakdown condition, respectively configuring a current and a voltage corresponding to a highest one of the electric leakage value as a secondary breakdown current and a secondary breakdown voltage;

obtaining, by the processing device, the design window;

determining, by the processing device, whether the component characteristic of the at least one protection component meets the design window to obtain a determination result; and generating, by the processing device, a visual graph including the design window, the determination result, and the voltage-current characteristic.

2. The method for processing the transmission line pulse data according to claim 1, wherein the design window includes an operating voltage value, a breakdown voltage value, and a required current capability, and the step of determining whether the component characteristic of the at least one protection component meets the design window comprises:

configuring a lowest voltage value of the transmission line pulse data less than the secondary breakdown voltage as a holding voltage;

configuring a highest voltage value of the transmission line pulse data less than the secondary breakdown voltage as a trigger voltage;

determining whether the component characteristic of the at least one protection component meets the design window; and when the component characteristic meets the design window, the holding voltage of the at least one protection component is greater than the operating voltage value, the trigger voltage is less than the breakdown voltage value, the secondary breakdown current is greater than the required current capability, and the secondary breakdown voltage is less than the breakdown voltage value.

3. The method for processing the transmission line pulse data according to claim 2, wherein the at least one protection component comprises a plurality of protection components and when the component characteristics of the plurality of protection components meet the design window, sorting the component characteristics of the plurality of protection components that meet the design window.

4. The method for processing the transmission line pulse data according to claim 3, wherein the component characteristic is the trigger voltage, the holding voltage, the secondary breakdown current, the secondary breakdown voltage, or a transient turn-on resistance.

5. A device for processing transmission line pulse data, configured to determine whether a component characteristic of at least one protection component meets a design window, the device comprising:

a data retrieving module configured to obtain the transmission line pulse data that includes a voltage-current characteristic generated by applying transmission pulses to the at least one protection component, wherein the transmission line pulse data include an electric leakage information, the electric leakage information includes electric leakage values generated by applying the transmission pulses that are different to the at least one protection component;

a test parameter setting module configured to receive the design window; and a processing module coupled to the data retrieving module and the test parameter setting module, wherein the processing module is configured to determine the component characteristic of the at least one protection component based on the voltage-current characteristic and determine whether the component characteristic of the at least one protection component meets the design window to obtain a determination result, thereby generating a visual graph with the design window, the determination result, and the voltage-current characteristic, when the processing module determines the component characteristic of the at least one protection component, the processing module determines whether the electric leakage values of the electric leakage information are greater than a current threshold value of a component breakdown condition that is given based on the component breakdown condition, wherein when the electric leakage value meets the component breakdown condition, a current and a voltage corresponding to the electric leakage value closest to and less than the current threshold value are respectively configured as a secondary breakdown current and a secondary breakdown voltage, and when the electric leakage value does not meet the component breakdown condition, a current and a voltage corresponding to a highest the electric leakage value are respectively configured as a secondary breakdown current and a secondary breakdown voltage.

6. The device for processing the transmission line pulse data according to claim 5, wherein the design window includes an operating voltage value, a breakdown voltage value, and a required current capability, and when the processing module determines whether the component characteristic of the at least one protection component meets the design window, a lowest voltage value of the transmission line pulse data less than the secondary breakdown voltage is configured as a holding voltage, and a highest voltage value of the transmission line pulse data less than the secondary breakdown voltage is configured as a trigger voltage, wherein when the processing module determines that the holding voltage of the at least one protection component is greater than the operating voltage value, that the trigger voltage is less than the breakdown voltage value, that the secondary breakdown current is greater than the required current capability, and that the secondary breakdown voltage is less than the breakdown voltage value, the component characteristic of the at least one protection component meets the design window.

7. The device for processing the transmission line pulse data according to claim 6, wherein the at least one protection component comprises a plurality of protection components and when the component characteristics of the plurality of protection components meet the design window, the processing module sorts the component characteristics of the plurality of protection components that meet the design window.

8. The device for processing the transmission line pulse data according to claim 7, wherein the component characteristic is the trigger voltage, the holding voltage, the secondary breakdown current, the secondary breakdown voltage, and/or a transient turn-on resistance.

9. The device for processing the transmission line pulse data according to claim 8, further comprising a filtering module coupled to the processing module, and the filtering module is configured to obtain a breakdown voltage value of a protected electronic component and determine a maximum clamping voltage of the at least one protection component less than the breakdown voltage value of the protected electronic component to determine whether the at least one protection component is used as a protection component of the protected electronic component.

10. The device for processing the transmission line pulse data according to claim 8, further comprising a historical test storing module coupled to the processing module and configured to store the component characteristics of protection components that have already been tested and the design window corresponding thereto, wherein the design window corresponds to at least one of a physical characteristic, an operating environment, and life expectancy of the protected electronic component.

11. The device for processing the transmission line pulse data according to claim 10, further comprising an artificial intelligence recommendation module coupled to the historical test storing module and the test parameter setting module and configured to recommend parameters of at least one of corresponding physical characteristics, an operating environment, and life expectancy as a recommended design window based on component characteristics of protection components that have already been tested and a corresponding the design window.

12. The device for processing the transmission line pulse data according to claim 11, wherein the artificial intelligence recommendation module is further configured to provide a new design window customized by a user to continuously optimize and adjust the recommended design window.

13. The device for processing the transmission line pulse data according to claim 8, further comprising an artificial intelligence-assisted determination module coupled to the processing module, and the processing module is configured to employ the artificial intelligence-assisted determination module to determine the secondary breakdown voltage, the secondary breakdown current, the trigger voltage, and the holding voltage of the transmission line pulse data.

14. A system for detecting transmission line pulses, the system comprising:

a device for processing the transmission line pulse data according to claim 5; and a connection module electrically connected to the data retrieving module of the device and at least one protection component.

* * * * *